United States Patent [19]

Easingwood-Wilson

[11] Patent Number: 4,991,175
[45] Date of Patent: Feb. 5, 1991

[54] SIGNATURE ANALYSIS

[75] Inventor: David Easingwood-Wilson, Balerno, Scotland

[73] Assignee: Hewlett-Packard, Wokingham

[21] Appl. No.: 492,370

[22] Filed: Mar. 9, 1990

Related U.S. Application Data

[63] Continuation of Ser. No. 418,926, Oct. 6, 1989, abandoned, which is a continuation of Ser. No. 74,848, Jul. 17, 1987, abandoned.

[51] Int. Cl.$^5$ .............................................. G06F 11/00
[52] U.S. Cl. .................................. 371/22.4; 371/15.1; 371/21.2
[58] Field of Search ...................... 371/22.4, 22.5, 22.6, 371/22.1, 21.6, 21.2, 26, 15.1

[56] References Cited

U.S. PATENT DOCUMENTS

| | | | |
|---|---|---|---|
| 3,573,751 | 4/1971 | Delisle | 371/22.4 X |
| 4,192,451 | 3/1980 | Swerling | 371/22.4 |
| 4,493,078 | 1/1985 | Daniels | 371/22.4 |
| 4,601,033 | 7/1986 | Whelan | 371/25 |
| 4,601,034 | 7/1986 | Sridhar | 371/25 |
| 4,733,405 | 3/1988 | Shimizume | 371/25 X |

OTHER PUBLICATIONS

Application Note 222-2, "Application Articles on Signature Analysis", Hewlett Packard Company, Publication No. 02-5952-7542, Oct. 1980.

Primary Examiner—Jerry Smith
Assistant Examiner—Robert W. Beausoliel

[57] ABSTRACT

Digital signal processing apparatus which can be tested by signature analysis is arranged so that a predetermined number of its ROM locations have stored therein pre-selected values whereby the signature analysis is independent of the contents of the remainder of the memory location. Appropriately valued bytes are stored in the N last-record memory location and these bytes establish a predetermined signature for each data pin regardless of firmware changes.

3 Claims, 1 Drawing Sheet

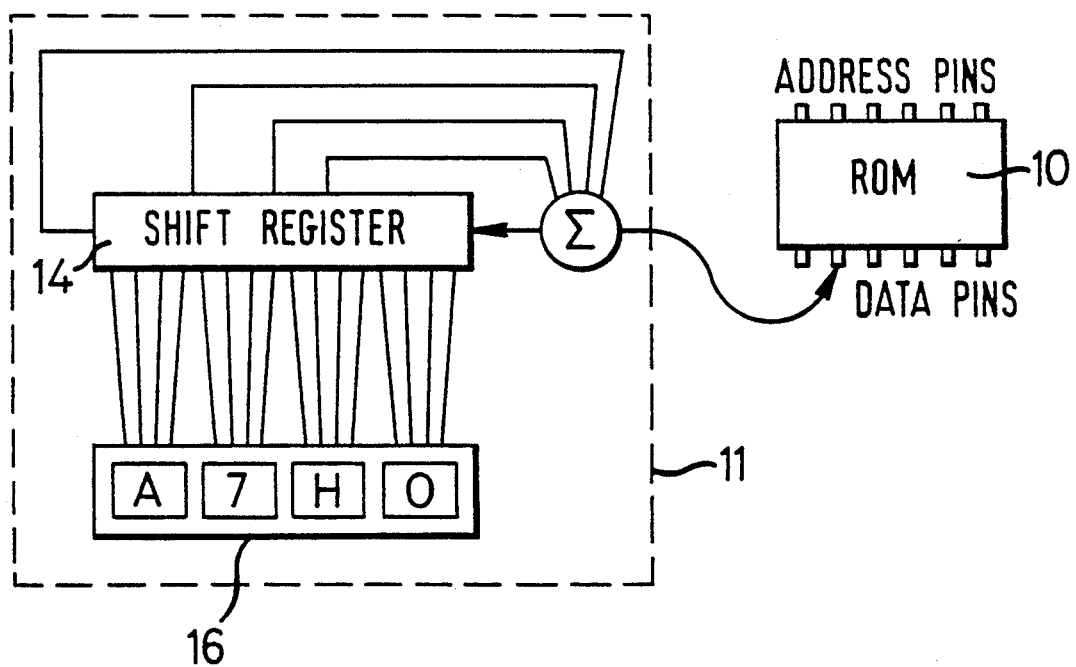

SIGNATURE ANALYSIS

This is a continuation of application Ser. No. 418,926 filed Oct. 6, 1989 which is a continuation of Ser. No. 07/074,848, filed July 17, 1987 both now abandoned.

BACKGROUND OF THE INVENTION

1. Field of the Invention

This invention relates to the testing of electronic digital apparatus. The invention particularly relates to the testing of such apparatus using a technique known as signature analysis.

2. Description of the Prior Art

In signature analysis bit sequences from an instrument under test are fed to an instrument known as a signature analyzer. Typically the signature analyzer incorporates a linear shift register which is clocked at the same rate as the bit stream under test. The linear shift register is provided with feedback from selected stages of the shift register and the feedback bits are summed in modulo 2 at the input to the shift register. A typical shift register will be 16 bits in length and at the end of a measurement sequence the 16 bits in the register comprise 4 groups in hexadecimal format which represent what is known as a signature. Each group of 4 bits represents an alpha numeric character and the four alpha numeric characters can be displayed on a suitable display device. The group of 4 alpha numeric characters are compared with the known good signature to thereby test the operation of the instrument. This method can be used to test a number of points within the circuit of an instrument. Typically the instrument manual will contain a list of signatures, one for each test point in the instrument, to enable easy checking of signatures expected at various locations. Signature analysis is a known technique which is now well documented in the art. Articles describing the technique can be found in Hewlett Packard Application Note 222-2.

Instruments which incorporate a processing capability can have self-test routines for use with a signature analyzer. Read only memory (ROM) associated with the processor is used to hold the software that runs on the processor. Signature analysis which involves data compression to reduce complex serial data stream patterns of a given length at a circuit node to a 4 digit decimal signature referred to above can be used to test such arrangements. The test is carried out by causing the contents of the ROM to appear at each data pin of the ROM. Then between each cycle of the full ROM's address space the pattern of data appearing at a pin is fed into a signature analyzer. The signature analyzer compresses the data as explained above to generate the hexadecimal signature referred to above. A problem with this technique, however, is that it suffers from the disadvantage that many signatures are dependent upon the contents of the ROM. As such they need updating and distributing each time an update of software or firmware occurs.

SUMMARY OF THE INVENTION

The present invention is concerned with arrangement which alleviates or overcomes this problem.

According to one aspect of the present invention there is provided apparatus having a digital signal processing capability including associated memory and a self-test facility of the type known as signature analysis characterized in that pre-selected locations of the memory have stored therein predetermined bits such that the signature analysis is independent of the contents of the remainder of the memory. The memory may be a read only memory. The pre-selected locations may be the last 16 bytes of the read only memory.

Another aspect of the present invention provides a method of arranging a ROM for signature analysis comprising feeding into pre-selected memory locations pre-calculated bytes. This preselected set of memory locations of reserved space is filled with values that force the signature of the remainder of the memory to a fixed value. That is, the value of the normal (or functional) data of the memory as a result of signature analysis on the memory plus the values stored in the reserved space force the signature of the entire memory to a desired predetermined signature. It is therefore possible to control the signature that will be produced by filling the reserved space with appropriate values. The computer program of the present invention computes the appropriate values of the reserved space to achieve this result. The program is run each time a new revision of memory is made thereby allowing the signature of the memory to remain unchanged after a revision.

BRIEF DESCRIPTION OF THE DRAWINGS

The invention will be described now by way of example only with particular reference to the accompanying drawing which is a block schematic diagram illustrating apparatus which can operate in accordance with the present invention.

DESCRIPTION OF THE PREFERRED EMBODIMENT

FIG. 1 shows a ROM 10 linked to a signature analyzer which is shown schematically at 11. The ROM is one which is associated with a processor in a processor controlled instrument or device. The signature analyzer is a known device and includes a linear feedback shift register 14. As shown in the drawing the 7th, 9th, 12th and 16th bits of the register are fed b its input and combined by modulo 2 addition in a manner well known in the art. To perform signature analysis on a ROM its memory locations are read in a predetermined order and the resulting bit stream on each data pin is fed in turn into the linear feedback shift register to produce a compressed pattern of bits in the 16 bits of the shift register. These bits comprise 4 groups defining a hexadecimal signature which are used to drive a display 16 for displaying 4 alpha numerical characters which are the signature for the particular pin under test and coupled to the shift register. The displayed signature is compared with the known good signature to evaluate the condition of the ROM.

In the present invention the ROM is arranged in such a way that 16 bytes at the end of the ROM are filled with 16 bytes of pre-calculated values whereby the signature of the entire ROM is fixed and predetermined. This means that the signatures are not dependent upon any changes which may occur to the firmware held in the ROM. A once-and-for-all table of signatures can be drawn up. The following illustrates how the 16 bytes can be evaluated.

The choice of the best signatures to use can be answered by forming the four hexadecimal numbers of the signature out of the two digits of the IC number in question followed by the two digits of the pin number being tested.

A computer program has been written to compute these 16 bytes. Inputs to the program are:
(1) A table of wanted signatures
(2) The ROM contents except for the last 16 bytes.
Outputs from the program are:
(3) the last 16 bytes of the ROM contents Once computed, these 16 bytes are appended into the rest of the data bytes prior to programming the ROM.

The computer program has two distinct parts:

(1) The first part computes a signature for each of the eight data columns of a ROM representing the entire contents less the final 16 bytes. This program mimics the behavior of a signature analyzer—the data bit clocked into the shift register is the modulo-2 addition of the next data bit and the current contents of the 7th, 9th, 12th and 16th bit of the shift register.

(2) The output from the first part and the desired signatures are combined by the second part to give the contents of the last 16 bytes. This is achieved by clocking the shift register 16 more times. On the first cycle, the output of the modulo-2 addition is the most significant bit of the desired signature; on the second cycle, the output is the next most significant bit, and so on.

The algorithms used are best illustrated by the use of a simplified computer program as follows. For a complete listing of the computer program of the present invention refer to Appendix A of the present application.

Consider just a single data column of the ROM (all other columns are treated similarly).

---

PART 1 OF COMPUTER PROGRAM

Let total size of ROM be n bytes.
Input:      (n-16) bits of data representing one column of
            data bits, held in array rom-data.
Output:     A 16 bit CRC value made up from the above (n-16)
            bits of data, held in variable crc.
BEGIN
crc := 0
FOR i:/=/ to data_length do
crc := ((rom±data(i))      EOR
(bit 7 of crc)             EOR
(bit 9 of crc)             EOR
(bit 12 of crc)            EOR
(bit 16 of crc)) + (2* crc) MOD 2   16;
NEXT i

---

PART 2 OF COMPUTER PROGRAM

Inputs:     The variable crc computed in Part 1
            The 16 bit variable representing the desired
            signature for the data column in question.
            Held in variable desired-sig.
Output:     The 16 bits needed to fill this column of the
            16 bytes at the end of the ROM. Held in
            variable rom-fill.
BEGIN
FOR i = 1 TO 16
rom-fill(i) :=   desired_sig[17-i] EOR
                (bit 7 of crc) EOR
                (bit 9 of crc) EOR
                (bit 12 of crc) EOR
                (bit 16 of crc)
crc := (desired_sig[17-i] +(2*crc))MOD 2   16(i) EOR

---

The following is an example of how the computer program of the present invention operates.

For purposes of illustration the entire ROM is considered to be 36 bytes, much shorter than would normally be the case. Of these 36 bytes, the first 20 bytes contain the normal or functional ROM data, and the final 16 bytes are the reserved bytes for the ROM signature. The computer program takes the first 20 bytes and produces the final 16 bytes. Since all columns of the ROM behave in a similar manner, only one column will be used in this example, column 0. Also, since the signature of each column is to be pre-chosen by the designer to be any signature desired, it is assumed in the present example that the designer has pre-chosen the signature of column 0 to be 1234 (hexidecimal).

A variable 'desired_sig' is defined, where desired_sig : array [1 ... 16] of integer;

This variable is initialized to 1234 (hexidecimal) as follows:

--- desired_sig [16] := 0;   (1 hex)
desired_sig [15] := 0;
desired_sig [14] := 0;
desired_sig [13] := 1;
desired_sig [12] := 0;   (2 hex)
desired_sig [11] := 0;
desired_sig [10] := 1;
desired_sig [9] := 0;
desired_sig [8] := 0;    (3 hex)
desired_sig [7] := 0;
desired_sig [6] := 1;
desired_sig [5] := 1;
desired_sig [4] := 0;    (4 hex)
desired_sig [3] := 1;
desired_sig [2] := 0;
desired_sig [1] := 0;

---

Another variable 'rom_data' is also defined and used in this example to hold the first 20 bits of data representing column 0 of the ROM.

const data _length = 20;
rom₁₃ data:array[1 ... data₁₃ length]of integer

In the present example this variable 'rom_data' is given some contents to mimic the real data the ROM would hold in practice. The actual contents have no direct bearing on the algorithm. Suitable random data is chosen as follows:

rom_data[1]:= 1;
rom_data[2]:= 1;
rom_data[3]:= 0;
rom_data[4]:= 1;
rom_data[5]:= 1;
rom_data[6]:= 0;
rom_data[7]:= 0;
rom_data[8]:= 1;
rom_data[9]:= 1;
rom_data[10]:= 1;
rom_data[11]:= 0;
rom_data[12]:= 1;
rom_data[13]:= 0;
rom_data[14]:= 0;
rom_data[15]:= 0;
rom_data[16]:= 1;
rom_data[17]:= 1;
rom_data[18]:= 0;
rom_data[19]:= 1;
rom_data[20]:= 1;

The computer program is split into two parts. The first part takes the rom_data and produces a number held in a variable 'crc':

var crc:integer; The program written in pseudo-code is

--- var i :      integer;
begin
crc :=    0;
for i :=  1 to data_length do
crc :=    ((rom_data [i] EOR
          (bit 7 of crc) EOR

```
              (bit 9 of crc) EOR
              (bit 12 of crc) EOR
              (bit 16 of crc)) + (2*crc)) MOD 2 ↑ 16;
    end
```

In this way, the variable 'crc' is determined which is a function of the first 20 bits of column 0 of the ROM contents. The following chart shows the output of this part of the program.

| Clock cycles after start | crc (binary) | | | | | | | | | | | | | | | | crc (decimal) | rom_data |
|---|---|---|---|---|---|---|---|---|---|---|---|---|---|---|---|---|---|---|
| | 16 | 15 | 14 | 13 | 12 | 11 | 10 | 9 | 8 | 7 | 6 | 5 | 4 | 3 | 2 | 1 | | |
| | 0 | 0 | 0 | 0 | 0 | 0 | 0 | 0 | 0 | 0 | 0 | 0 | 0 | 0 | 0 | 0 | 0 | |
| 1 | 0 | 0 | 0 | 0 | 0 | 0 | 0 | 0 | 0 | 0 | 0 | 0 | 0 | 0 | 0 | 1 | 1 | 1 |
| 2 | 0 | 0 | 0 | 0 | 0 | 0 | 0 | 0 | 0 | 0 | 0 | 0 | 0 | 0 | 1 | 1 | 3 | 1 |
| 3 | 0 | 0 | 0 | 0 | 0 | 0 | 0 | 0 | 0 | 0 | 0 | 0 | 0 | 1 | 1 | 0 | 6 | 0 |
| 4 | 0 | 0 | 0 | 0 | 0 | 0 | 0 | 0 | 0 | 0 | 0 | 0 | 1 | 1 | 0 | 1 | 13 | 1 |
| 5 | 0 | 0 | 0 | 0 | 0 | 0 | 0 | 0 | 0 | 0 | 0 | 1 | 1 | 0 | 1 | 1 | 27 | 1 |
| 6 | 0 | 0 | 0 | 0 | 0 | 0 | 0 | 0 | 0 | 0 | 1 | 1 | 0 | 1 | 1 | 0 | 54 | 0 |
| 7 | 0 | 0 | 0 | 0 | 0 | 0 | 0 | 0 | 0 | 1 | 1 | 0 | 1 | 1 | 0 | 0 | 108 | 0 |
| 8 | 0 | 0 | 0 | 0 | 0 | 0 | 0 | 0 | 1 | 1 | 0 | 1 | 1 | 0 | 0 | 0 | 216 | 1 |
| 9 | 0 | 0 | 0 | 0 | 0 | 0 | 0 | 1 | 1 | 0 | 1 | 1 | 0 | 0 | 0 | 0 | 432 | 1 |
| 10 | 0 | 0 | 0 | 0 | 0 | 0 | 1 | 1 | 0 | 1 | 1 | 0 | 0 | 0 | 0 | 0 | 864 | 1 |
| 11 | 0 | 0 | 0 | 0 | 0 | 1 | 1 | 0 | 1 | 1 | 0 | 0 | 0 | 0 | 0 | 0 | 1728 | 0 |
| 12 | 0 | 0 | 0 | 0 | 1 | 1 | 0 | 1 | 1 | 0 | 0 | 0 | 0 | 0 | 0 | 0 | 3456 | 1 |
| 13 | 0 | 0 | 0 | 1 | 1 | 0 | 1 | 1 | 0 | 0 | 0 | 0 | 0 | 0 | 0 | 0 | 6912 | 0 |
| 14 | 0 | 0 | 1 | 1 | 0 | 1 | 1 | 0 | 0 | 0 | 0 | 0 | 0 | 0 | 0 | 0 | 13824 | 0 |
| 15 | 0 | 1 | 1 | 0 | 1 | 1 | 0 | 0 | 0 | 0 | 0 | 0 | 0 | 0 | 0 | 0 | 27648 | 0 |
| 16 | 1 | 1 | 0 | 1 | 1 | 0 | 0 | 0 | 0 | 0 | 0 | 0 | 0 | 0 | 0 | 0 | 55296 | 1 |
| 17 | 1 | 0 | 1 | 1 | 0 | 0 | 0 | 0 | 0 | 0 | 0 | 0 | 0 | 0 | 0 | 1 | 45057 | 1 |
| 18 | 0 | 1 | 1 | 0 | 0 | 0 | 0 | 0 | 0 | 0 | 0 | 0 | 0 | 0 | 1 | 1 | 24579 | 0 |
| 19 | 1 | 1 | 0 | 0 | 0 | 0 | 0 | 0 | 0 | 0 | 0 | 0 | 1 | 1 | 1 | 1 | 45159 | 1 |
| 20 | 1 | 0 | 0 | 0 | 0 | 0 | 0 | 0 | 0 | 0 | 0 | 1 | 1 | 1 | 1 | 0 | 32782 | 1 |

The value of 'crc' of 32782 (decimal) in this example, is the output of the first part of the computer program.

The second part of the computer program uses as its inputs the variable 'crc' calculated above and also the variable 'desired_sig'. As output, the second part of the program provides the 16 bits needed to fill the final 16 bits of column 0 of the ROM. A variable 'rom_fill' in this example, is defined to hold these 16 bits:

rom_13 fill:array[1 ... 16] of integer;

This part of the program written in pseudo-code is:

```
begin
```
```
for i : = 1 to 16 do begin
    rom_fill [i] : =     (desired_sig [17-i]      EOR
                         (bit 7 of crc)           EOR
                         (bit 9 of crc)           EOR
                         (bit 12 of crc)          EOR
                         (bit 16 of crc));
    crc : = (desired_sig [17-i] +(2+crc)) MOD 2 ↑ 16
    end;
end;
```

The subscript [17-i], here is used instead of [i] to keep the correct order of the bits within 'desired_sig'.

This second part of the program yields the variable 'rom_fill'. The following chart shows the output of this second part of the program.

| clock cycles after start | crc (binary) | | | | | | | | | | | | | | | | crc (decimal) | desired_sig | rom_fil |
|---|---|---|---|---|---|---|---|---|---|---|---|---|---|---|---|---|---|---|---|
| | 16 | 15 | 14 | 13 | 12 | 11 | 10 | 9 | 8 | 7 | 6 | 5 | 4 | 3 | 2 | 1 | | | |
| | 1 | 0 | 0 | 0 | 0 | 0 | 0 | 0 | 0 | 0 | 0 | 0 | 1 | 1 | 1 | 0 | 32782 | | |
| 1 | 0 | 0 | 0 | 0 | 0 | 0 | 0 | 0 | 0 | 0 | 0 | 1 | 1 | 1 | 0 | 0 | 28 | 0 | 1 |
| 2 | 0 | 0 | 0 | 0 | 0 | 0 | 0 | 0 | 0 | 0 | 1 | 1 | 1 | 0 | 0 | 0 | 56 | 0 | 0 |
| 3 | 0 | 0 | 0 | 0 | 0 | 0 | 0 | 0 | 0 | 1 | 1 | 1 | 0 | 0 | 0 | 0 | 112 | 0 | 0 |
| 4 | 0 | 0 | 0 | 0 | 0 | 0 | 0 | 0 | 1 | 1 | 1 | 0 | 0 | 0 | 0 | 1 | 225 | 1 | 0 |
| 5 | 0 | 0 | 0 | 0 | 0 | 0 | 0 | 1 | 1 | 1 | 0 | 0 | 0 | 0 | 1 | 0 | 450 | 0 | 1 |
| 6 | 0 | 0 | 0 | 0 | 0 | 0 | 1 | 1 | 1 | 0 | 0 | 0 | 0 | 1 | 0 | 0 | 900 | 0 | 0 |
| 7 | 0 | 0 | 0 | 0 | 0 | 1 | 1 | 1 | 0 | 0 | 0 | 0 | 1 | 0 | 0 | 1 | 1801 | 1 | 0 |
| 8 | 0 | 0 | 0 | 0 | 1 | 1 | 1 | 0 | 0 | 0 | 0 | 1 | 0 | 0 | 1 | 0 | 3602 | 0 | 1 |
| 9 | 0 | 0 | 0 | 1 | 1 | 1 | 0 | 0 | 0 | 0 | 1 | 0 | 0 | 1 | 0 | 0 | 7204 | 0 | 1 |
| 10 | 0 | 0 | 1 | 1 | 1 | 0 | 0 | 0 | 0 | 1 | 0 | 0 | 1 | 0 | 0 | 0 | 14408 | 0 | 1 |
| 11 | 0 | 1 | 1 | 1 | 0 | 0 | 0 | 0 | 1 | 0 | 0 | 1 | 0 | 0 | 0 | 1 | 28817 | 1 | 1 |
| 12 | 1 | 1 | 1 | 0 | 0 | 0 | 0 | 1 | 0 | 0 | 1 | 0 | 0 | 0 | 1 | 1 | 57635 | 1 | 1 |
| 13 | 1 | 1 | 0 | 0 | 0 | 0 | 1 | 0 | 0 | 1 | 0 | 0 | 0 | 1 | 1 | 0 | 49734 | 0 | 0 |
| 14 | 1 | 0 | 0 | 0 | 0 | 1 | 0 | 0 | 1 | 0 | 0 | 0 | 1 | 1 | 0 | 1 | 33933 | 1 | 1 |
| 15 | 0 | 0 | 0 | 0 | 1 | 0 | 0 | 1 | 0 | 0 | 0 | 1 | 1 | 0 | 1 | 0 | 2330 | 0 | 1 |
| 16 | 0 | 0 | 0 | 1 | 0 | 0 | 1 | 0 | 0 | 0 | 1 | 1 | 0 | 1 | 0 | 0 | 4660 | 0 | 0 |

These values for the 16 elements of 'rom_fil' are appended for the 'rom_data' bits before the entire data elements are programmed into the ROM.

The above technique is shown in its entirety below. The entire ROM bits of column 0 are shown after the program of the present invention has been run and it can be seen that the final signature is equal to the signature initially chosen (or 1234 hex in this example).

| Clock cycles after start | crc (binary) | | | | | | | | | | | | | | | | crc (decimal) | rom_data | |
|---|---|---|---|---|---|---|---|---|---|---|---|---|---|---|---|---|---|---|---|
| | 16 | 15 | 14 | 13 | 12 | 11 | 10 | 9 | 8 | 7 | 6 | 5 | 4 | 3 | 2 | 1 | | | |
| 0 | 0 | 0 | 0 | 0 | 0 | 0 | 0 | 0 | 0 | 0 | 0 | 0 | 0 | 0 | 0 | 0 | 0 | | |
| 1 | 0 | 0 | 0 | 0 | 0 | 0 | 0 | 0 | 0 | 0 | 0 | 0 | 0 | 0 | 0 | 1 | 1 | 1 | ⎤ |
| 2 | 0 | 0 | 0 | 0 | 0 | 0 | 0 | 0 | 0 | 0 | 0 | 0 | 0 | 0 | 1 | 1 | 3 | 1 | |
| 3 | 0 | 0 | 0 | 0 | 0 | 0 | 0 | 0 | 0 | 0 | 0 | 0 | 0 | 1 | 1 | 0 | 6 | 0 | |
| 4 | 0 | 0 | 0 | 0 | 0 | 0 | 0 | 0 | 0 | 0 | 0 | 0 | 1 | 1 | 0 | 1 | 13 | 1 | |
| 5 | 0 | 0 | 0 | 0 | 0 | 0 | 0 | 0 | 0 | 0 | 0 | 1 | 1 | 0 | 1 | 1 | 27 | 1 | |
| 6 | 0 | 0 | 0 | 0 | 0 | 0 | 0 | 0 | 0 | 0 | 1 | 1 | 0 | 1 | 1 | 0 | 54 | 0 | |
| 7 | 0 | 0 | 0 | 0 | 0 | 0 | 0 | 0 | 0 | 1 | 1 | 0 | 1 | 1 | 0 | 0 | 108 | 0 | |
| 8 | 0 | 0 | 0 | 0 | 0 | 0 | 0 | 0 | 1 | 1 | 0 | 1 | 1 | 0 | 0 | 0 | 216 | 1 | |
| 9 | 0 | 0 | 0 | 0 | 0 | 0 | 0 | 1 | 1 | 0 | 1 | 1 | 0 | 0 | 0 | 0 | 432 | 1 | |
| 10 | 0 | 0 | 0 | 0 | 0 | 0 | 1 | 1 | 0 | 1 | 1 | 0 | 0 | 0 | 0 | 0 | 864 | 1 | rom_data |
| 11 | 0 | 0 | 0 | 0 | 0 | 1 | 1 | 0 | 1 | 1 | 0 | 0 | 0 | 0 | 0 | 0 | 1728 | 0 | |
| 12 | 0 | 0 | 0 | 0 | 1 | 1 | 0 | 1 | 1 | 0 | 0 | 0 | 0 | 0 | 0 | 0 | 3456 | 1 | |
| 13 | 0 | 0 | 0 | 1 | 1 | 0 | 1 | 1 | 0 | 0 | 0 | 0 | 0 | 0 | 0 | 0 | 6912 | 0 | |
| 14 | 0 | 0 | 1 | 1 | 0 | 1 | 1 | 0 | 0 | 0 | 0 | 0 | 0 | 0 | 0 | 0 | 13824 | 0 | |
| 15 | 0 | 1 | 1 | 0 | 1 | 1 | 0 | 0 | 0 | 0 | 0 | 0 | 0 | 0 | 0 | 0 | 27648 | 0 | |
| 16 | 1 | 1 | 0 | 1 | 1 | 0 | 0 | 0 | 0 | 0 | 0 | 0 | 0 | 0 | 0 | 0 | 55296 | 1 | |
| 17 | 1 | 0 | 1 | 1 | 0 | 0 | 0 | 0 | 0 | 0 | 0 | 0 | 0 | 0 | 0 | 1 | 45057 | 1 | |
| 18 | 0 | 1 | 1 | 0 | 0 | 0 | 0 | 0 | 0 | 0 | 0 | 0 | 0 | 1 | 1 | 1 | 24579 | 0 | |
| 19 | 1 | 1 | 0 | 0 | 0 | 0 | 0 | 0 | 0 | 0 | 0 | 0 | 1 | 1 | 1 | 1 | 45159 | 1 | |
| 20 | 1 | 0 | 0 | 0 | 0 | 0 | 0 | 0 | 0 | 0 | 0 | 1 | 1 | 1 | 1 | 0 | 32782 | 1 | ⎦ |
| 21 | 0 | 0 | 0 | 0 | 0 | 0 | 0 | 0 | 0 | 0 | 1 | 1 | 1 | 0 | 0 | 0 | 28 | 1 | ⎤ |
| 22 | 0 | 0 | 0 | 0 | 0 | 0 | 0 | 0 | 0 | 1 | 1 | 1 | 0 | 0 | 0 | 0 | 56 | 0 | |
| 23 | 0 | 0 | 0 | 0 | 0 | 0 | 0 | 0 | 1 | 1 | 1 | 0 | 0 | 0 | 0 | 0 | 112 | 0 | |
| 24 | 0 | 0 | 0 | 0 | 0 | 0 | 0 | 1 | 1 | 1 | 0 | 0 | 0 | 0 | 0 | 1 | 225 | 0 | |
| 25 | 0 | 0 | 0 | 0 | 0 | 0 | 1 | 1 | 1 | 0 | 0 | 0 | 0 | 0 | 1 | 0 | 450 | 1 | |
| 26 | 0 | 0 | 0 | 0 | 0 | 1 | 1 | 1 | 0 | 0 | 0 | 0 | 0 | 1 | 0 | 0 | 900 | 0 | |
| 27 | 0 | 0 | 0 | 0 | 1 | 1 | 1 | 0 | 0 | 0 | 0 | 0 | 1 | 0 | 0 | 1 | 1801 | 0 | |
| 28 | 0 | 0 | 0 | 1 | 1 | 1 | 0 | 0 | 0 | 0 | 0 | 1 | 0 | 0 | 1 | 0 | 3602 | 1 | rom_fill |
| 29 | 0 | 0 | 1 | 1 | 1 | 0 | 0 | 0 | 0 | 0 | 1 | 0 | 0 | 1 | 0 | 0 | 7204 | 1 | |
| 30 | 0 | 1 | 1 | 1 | 0 | 0 | 0 | 0 | 0 | 1 | 0 | 0 | 1 | 0 | 0 | 0 | 14408 | 1 | |
| 31 | 1 | 1 | 1 | 0 | 0 | 0 | 0 | 0 | 1 | 0 | 0 | 1 | 0 | 0 | 0 | 1 | 28817 | 1 | |
| 32 | 1 | 1 | 0 | 0 | 0 | 0 | 0 | 1 | 0 | 0 | 1 | 0 | 0 | 0 | 1 | 1 | 57635 | 1 | |
| 33 | 1 | 0 | 0 | 0 | 0 | 0 | 1 | 0 | 0 | 1 | 0 | 0 | 0 | 1 | 1 | 0 | 49734 | 0 | |
| 34 | 1 | 0 | 0 | 0 | 0 | 1 | 0 | 0 | 1 | 0 | 0 | 0 | 1 | 1 | 0 | 1 | 33933 | 1 | |
| 35 | 0 | 0 | 0 | 0 | 1 | 0 | 0 | 1 | 0 | 0 | 0 | 1 | 1 | 0 | 1 | 0 | 2330 | 1 | |
| 36 | 0 | 0 | 0 | 1 | 0 | 0 | 1 | 0 | 0 | 0 | 1 | 1 | 0 | 1 | 0 | 0 | 4660 | 0 | ⎦ |
| | 1 | | | | 2 | | | | 3 | | | | 4 | | | | (hex) | | |

From the last line it will be seen that the required signature of 1234 (hex) is obtained.

APPENDIX A

```
;***************************************************************
;*                                                             *
;*                                                             *
;*                                                             *
;*                                                             *
;*                                                             *
;*                                                             *
;*                                                             *
;*                                                             *
;*                                                             *
;*                                                             *
;*                                                             *
;*                                                             *
;*                                                             *
;*                                                             *
;*                                                             *
;* Module Name  : SA_BT                                        *
;*                                                             *
;* Change Record :                                             *
;*                                                             *
;*   DATE                  DESCRIPTION                         *
;*   ----                  -----------                         *
;*                                                             *
;***************************************************************

GLB         Wanted_sigs

Wanted_sigs   DW          01611H       ;ROM 3 SIGS
              DW          01612H
              DW          01613H
              DW          01615H
              DW          01616H
```

```
                    DW          01617H
                    DW          01618H
                    DW          01619H
                    DW          01711H
                    DW          01712H                  ;ROM 4 SIGS
                    DW          01713H
                    DW          01715H
                    DW          01716H
                    DW          01717H
                    DW          01718H
                    DW          01719H

GLB         SIG_GEN
    SIG_GEN         PROC FAR
                    PUSH        ES                                  ;Save the extra segment.
                    PUSH        BP                                  ;Save pascal stack frame.
                    MOV         BX,DS:WORD PTR Source_byte_ptr      ;Get offset addr of first byte.
                    MOV         AX,DS:WORD PTR Source_byte_ptr+2    ;Get segment addr of first byte.
                    MOV         ES,AX                               ;Load seg addr to seg register.
                    MOV         SI,0FFF0H                           ;Initialise counter with number of bytes.
                    MOV         CL,DS:BYTE PTR Data_bit             ;Get bit of data bus to be evaluated.
                    DEC         CL                                  ;Decrement to give shift requirement.
                    MOV         AX,0                                ;Initialise result register.
    Label_200       MOV         CH,ES:[BX]                          ;Get byte.
                    CALL        SIG_CALC                            ;Put thru s/w shift register.
                    DEC         BX                                  ;Point to next byte.
                    DEC         SI                                  ;Decrement counter.
                    JNZ         Label_200                           ;If not last byte, process next byte
                    PUSH        AX                                  ;Save shift register state on stack.
                    MOV         BX,OFFSET Wanted_sigs               ;Get offset of desired signature table head.
                    MOV         AX,SEG Wanted_sigs                  ;Get segment of above table .
                    MOV         ES,AX                               ;Load it to segment register.
                    POP         AX                                  ;Recover shift register state.
                    CMP         DS:WORD PTR Source_byte_ptr+2,0F000H  ;Check which rom being tested
                    JNE         EO_ROM                              ; and adjust table pointer
                    ADD         BX,0010H                            ; to access correct signatures.
    EO_ROM          MOV         CL,DS:BYTE PTR Data_bit             ; Get which bit of data bus
                    DEC         CL                                    being analysed, double it,
                    ADD         CL,CL                                 and add to table pointer to
                    MOV         CH,0                                  access required signature
                    ADD         BX,CX                                 from the ordered table.
                    MOV         BP,OFFSET Stream                    ; Load pointer to ram result area.
                    MOV         SI,8000H                            ; Load masking register.
                    MOV         CX,0                                ; Initialise result register.
                    CALL        PREDICT                             ; Calculate strem required for correct result.
                    PUSH        CX                                  ; Save resultant stream on stack.
                    MOV         CL,DS:BYTE PTR Data_bit             ; Get data bit being evaluated
                    DEC         CL                                    subtract 1, double it, and
                    ADD         CL,CL                                 add it to the intermediate
                    MOV         CH,0                                  result pointer to give address in
                    ADD         BP,CX                                 ram where this data stream is
                    POP         CX                                    stored.
                    MOV         [BP],CX
                    MOV         DS:BYTE PTR CRC_L,AL                ; Save final state of the shift
                    MOV         DS:BYTE PTR CRC_M,AH                  register for double check if required.
                    CMP         DS:BYTE PTR Data_bit,8              ; Has last data bit been processed?
                    JNE         FORGET_IT                           ; If not return to pascal for further instructions
                    CALL        SHUFFLE                             ; If last bit processed call routine to convert
    FORGET_IT       POP         BP                                    the streams into bytes to be loaded into proms.
                    POP         ES                                  ; Recover pascal environment & return.
                    RET
```

;****************************************************************
;* This routine is called to find the 16 data bits which must be    *
;* clocked thru the software shift register such that its final     *
;* state (or signature) becomes the desired pattern. The desired    *
;* pattern is picked up from the table of values <Wanted_sigs>.     *
;* When the routine is called, all ROM data except for the last     *
;* 16 bits has been clocked thru the shift register, hence the next *
;* data bit clocked will be the M.S.Bit of the final signature.     *
;* Modulo 2 arithmetic is carried out on the shift register feedback *
;* elements and the partial result compared with the M.S.Bit of the *
;* desired signature. To deduce the required data bit, 2 situations *
;* are handled. If a zero is required in the final signature, the   *
;* data bit is just equal to the L.S.Bit of the partial modulo 2    *
;* addition of the register feedback elements. This is because      *
;* adding the L.S.Bit of a number to the number itself guarantees   *
;* that the L.S.Bit of the result will be zero. Similarly, if a one *
;* is required in the signature the data bit will be equal to the   *
;* inverse of the L.S.Bit of the partial addition since adding this *
;* guarantees an odd result. The data bit thus deduced is clocked   *
;* both into a result register and into the software shift register. *

* The process is repeated for each bit of the desired signature.   *
* producing at the end of the routine a 16 bit binary number which *
* is the serial sequence required to force the signature of that   *
* bit of the data bus to the desired value. This value is stored in *
* RAM in array <Stream>.                                           *
;*                                                                 *
;*          Reg BX —> Points to desired signature in table         *
;*                    <Wanted_sigs>.                               *
;*          Reg AX —> The software shift register.                 *
;*          Reg CX —> Contains the 16 bit result sequence.         *
;*          Reg SI —> Used to select bit of final signature        *
;*                    under test.                                  *
;*          Reg DL —> Used to perform addition.                    *
;*          Reg DH —> Used as temporary store for partial result   *
;*                    of addition.                                 *
;*******************************************************************

```
PREDICT     PROC NEAR

NOP
AGAIN       MOV         DL,0            ; Initialise counter
PRED1       TEST        AH,#SEVEN       ; Test 16th bit of shift register
            JZ          PRED2           ; If zero dont increment count
            INC         DL              ; If one increment counter
PRED2       TEST        AH,#THREE       ; Test 12th bit of shift register
            JZ          PRED3           ; If zero dont increment count
            INC         DL              ; If one increment counter
PRED3       TEST        AH,#ZERO        ; Test 9th bit of shift register
            JZ          PRED4           ; If zero dont increment count
            INC         DL              ; If one increment count
PRED4       TEST        AL,SIX          ; Test 7th bit of shift register
            JZ          END_PRED        ; If zero dont increment count
            INC         DL              ; If one increment count
END_PRED    TEST        ES:[BX],SI      ; Check bit.wanted in final signature
            JZ          ZERO_WANTED     ; If zero wanted then jump
            MOV         DH,DL           ; If one wanted , save the partial addition
            INC         DL              ; Invert the L.S.Bit to get required data bit
            SHR         DL              ; Put required data bit in carry flag
            RCL         CX              ; Store it in the result register
            MOV         DL,DH           ; Recover the partial addition
            INC         DH              ; Invert again to get data to be clocked into S.Reg
            TEST        DH,#ZERO        ; Check data as before
            JZ          NO_INC          ; If zero dont increment count
            INC         DL              ; if one increment count
NO_INC      SHR         DL              ; Shift L.S.Bit of total addition to carry
            RCL         AX              ; Shift into shift register
            JMP         NEXT_BIT        ; Finished so loop around
ZERO_WANTED MOV         DH,DL           ; Zero wanted in final signature,save partial addition
            SHR         DL              ; Get L.S.Bit into carry
            RCL         CX              ; Put into final result
            TEST        DH,#ZERO        ; Check the final addition as before (same as partial in this case)
            JZ          NO_INC2         ; If zero dont increment counter
            INC         DH              ; if one increment the counter
NO_INC2     SHR         DH              ; Put L.S.Bit into carry
            RCL         AX              ; Shift carry into shift register
NEXT_BIT    SHR         SI,1            ; Shift mask byte to select next bit of required signature
            JNZ         AGAIN           ; If not last bit done go again
            RET                         ; If last bit done return to calling routine
```

;*******************************************************************
;* This routine reformats the results from the prediction routines to *
;* give the bytes which, when loaded into the last 16 bytes of ROM,  *
;* will give the desired signatures.  At the end of the predict      *
;* routine array <Stream> contains 8 words which represent the data  *
;* streams required on each of the 8 rom data bus bits to make the   *
;* signature of that bit equal to the desired value.  To put these   *
;* data streams into ROM they must be reformatted into 16 bytes, each *
;* byte containing one bit from each of the 8 words. Thus for example *
;* the byte in Rom address 0000H should be composed of the M.S.Bits   *
;* of all 8 words in <Stream> and the M.S.Bit of that byte should     *
;* come from the word which contains the stream calculated for bit 8  *
;* of the data bus.                                                  *
;*      This is achieved by simply shifting out a bit at a time from *
;* each word into a byte wide register and storing the full register *
;* in array <Top>.  At the end of the routine <Top> contains the 16  *
;* bytes which should be loaded to the rom.  The first byte in the   *
;* array, i.e. at <Top+0>, should be loaded at rom address 0000H ect. *
;*                                                                   *
;*          Reg CX —> Used as loop counter and offset to address     *
;*                    result array <Top>.                            *
;*          Reg BX —> Used as offset to address word array           *
;*                    <Stream> and as a pointer to address           *
;*                    result array <Top>.                            *
;*          Reg AL —> Used to construct bytes from bits of the       *
;*                    word array.                                    *
;*******************************************************************

```
SHUFFLE         PROC    NEAR
                MOV     CL,0                            ; Initaialise offset counter.
                MOV     CH,0                            ; Initaialise offset counter.
LOOPP           MOV     BX,14                           ; Initialise pointer offset.
                MOV     AL,0                            ; Initialise result register
LOOPO           SHR     DS:WORD PTR Stream[BX],1        ; Get L.S.Bit of word.
                RCL     AL                              ; Shift into result.
                SUB     BX,2                            ; Point to next word.
                JNS     LOOPO                           ; Loop round to get next bit.
                MOV     BX,OFFSET Top                   ; If all 8 bits got,
                ADD     BX,CX                           ;   load result to correct
                MOV     [BX],AL                         ;   position in result array
                INC     CL                              ; Increment loop counter.
                CMP     CL,16                           ; Check if last loop done.
                JNE     LOOPP                           ; If not do next loop.
                RET                                     ; If so return.

;***************************************************************
;*  This routine does the software simulation of a 16 bit shift    *
;*  register with feedback taps on the 7th,9th,12th, & 16th bits   *
;*  The routine performs modulo 2 arithmetic on the above bits of  *
;*  the register and on the next data bit to be shifted in. The    *
;*  LSBit of the result becomes the bit actually shifted in on the *
;*  right when the entire register is shifted left.                *
;*                                                                 *
;*      Reg CH --> Contains the rom byte to be processed.          *
;*                                                                 *
;*      Reg CL --> Contains the number of bits required            *
;*                 to shift the desired bit of the byte            *
;*                 under test to the l.s.bit of CH.                *
;*                                                                 *
;*      Reg AX --> Contains the current state of the shift         *
;*                 register.                                       *
;*                                                                 *
;*      Reg DL --> Is used to perform the modulo 2 arithmetic      *
;***************************************************************

SIG_CALC        PROC    NEAR
                MOV     DL,0            ; Initialise counter to do modulo 2 arith.
                SHR     CH,CL           ; Get required bit of data byte.
                TEST    CH,#ZERO        ; Check that bit
                JZ      TERM1           ; If its zero, don't increment counter
                INC     DL              ; If its one increment counter
TERM1           TEST    AH,#SEVEN       ; Test 16th bit of shift register
                JZ      TERM2           ; If zero dont increment counter
                INC     DL              ; If one increment counter
TERM2           TEST    AH,#THREE       ; Test 12th bit of shift register
                JZ      TERM3           ; If zero dont increment counter
                INC     DL              ; If one increment counter
TERM3           TEST    AH,#ZERO        ; Test 9th bit of shift register
                JZ      TERM4           ; If zero dont increment counter
                INC     DL              ; If one increment counter
TERM4           TEST    AL,SIX          ; Test 7th bit of shift register
                JZ      END_TERM        ; If zero dont increment counter
                INC     DL              ; If one increment counter
END_TERM        SHR     DL              ; Put L.S.Bit of count into carry
                RCL     AX              ; Shift carry into shift register
                RET                     ; Return to calling routine
```

I claim:

1. Apparatus having a digital signal processing capability, said apparatus comprising memory means and a self-test facility means capable of signature analysis, said apparatus configured such that pre-selected locations of said memory means have stored therein predetermined bits such that the value of the preselected locations plus the value of a result of an updated signature analysis of the remainder of the memory means equal a desired predetermined signature.

2. Apparatus according to claim 1 wherein said memory means is read only memory means.

3. Apparatus according to claim 2 wherein said preselected locations are the last 16 bytes of said read only memory means.

* * * * *